US006898844B2

(12) United States Patent
Olsen

(10) Patent No.: US 6,898,844 B2
(45) Date of Patent: May 31, 2005

(54) METHOD FOR REDUCING MULTILINE EFFECTS ON A PRINTED CIRCUIT BOARD

(75) Inventor: Christopher N. Olsen, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/964,810

(22) Filed: Sep. 28, 2001

(65) Prior Publication Data

US 2003/0061711 A1 Apr. 3, 2003

(51) Int. Cl.[7] .............................................. H01R 43/00
(52) U.S. Cl. ...................................... 29/825; 846/847
(58) Field of Search ........................ 20/825, 830, 846, 20/847, 852

(56) References Cited

FOREIGN PATENT DOCUMENTS

| JP | 04-079354 | * | 3/1992 |
|----|-----------|---|--------|
| JP | 04-290297 | * | 10/1992 |
| JP | 04-313300 | * | 11/1992 |
| JP | 07-245575 | * | 9/1995 |
| JP | 2000-244133 | * | 9/2000 |

OTHER PUBLICATIONS

The Development of a SPICE Model to Predict the Crosstalk Reduction of Coupled Lines, by D.N. Ladd et al Symposium on Antenna Technology and Applied Electromahnetics 1990 Conference Proc. First Ed. p. 761–5 1990.*

* cited by examiner

Primary Examiner—Carl J. Arbes
(74) Attorney, Agent, or Firm—Kenyon & Kenyon

(57) ABSTRACT

A method is provided for designing a printed circuit board. This may include analyzing at least one characteristic of a first plurality of relatively parallel conductive paths on the printed circuit board. The first plurality of relatively parallel conductive paths may be arranged in a pattern in a first area of the printed circuit board. The method may also include rearranging the pattern of conductive paths such that a second plurality of relatively parallel conductive paths in a second area of the printed circuit board have a different geometry or arrangement with respect to one another as compared to a geometry or arrangement of the first plurality of relatively parallel conductive paths in the first area.

20 Claims, 7 Drawing Sheets

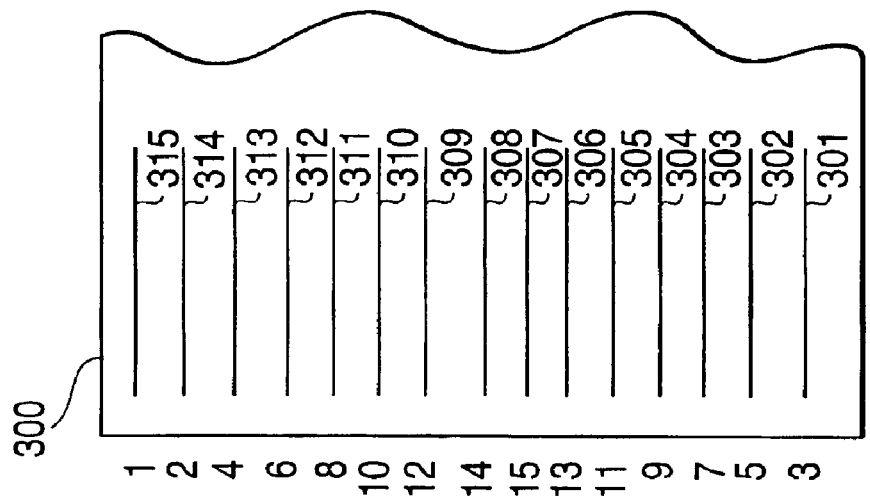
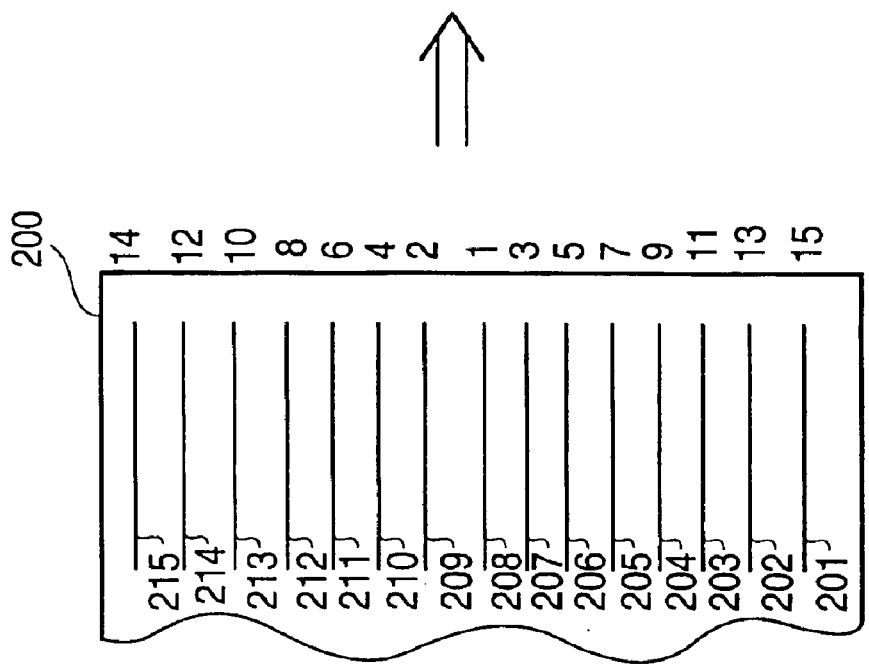

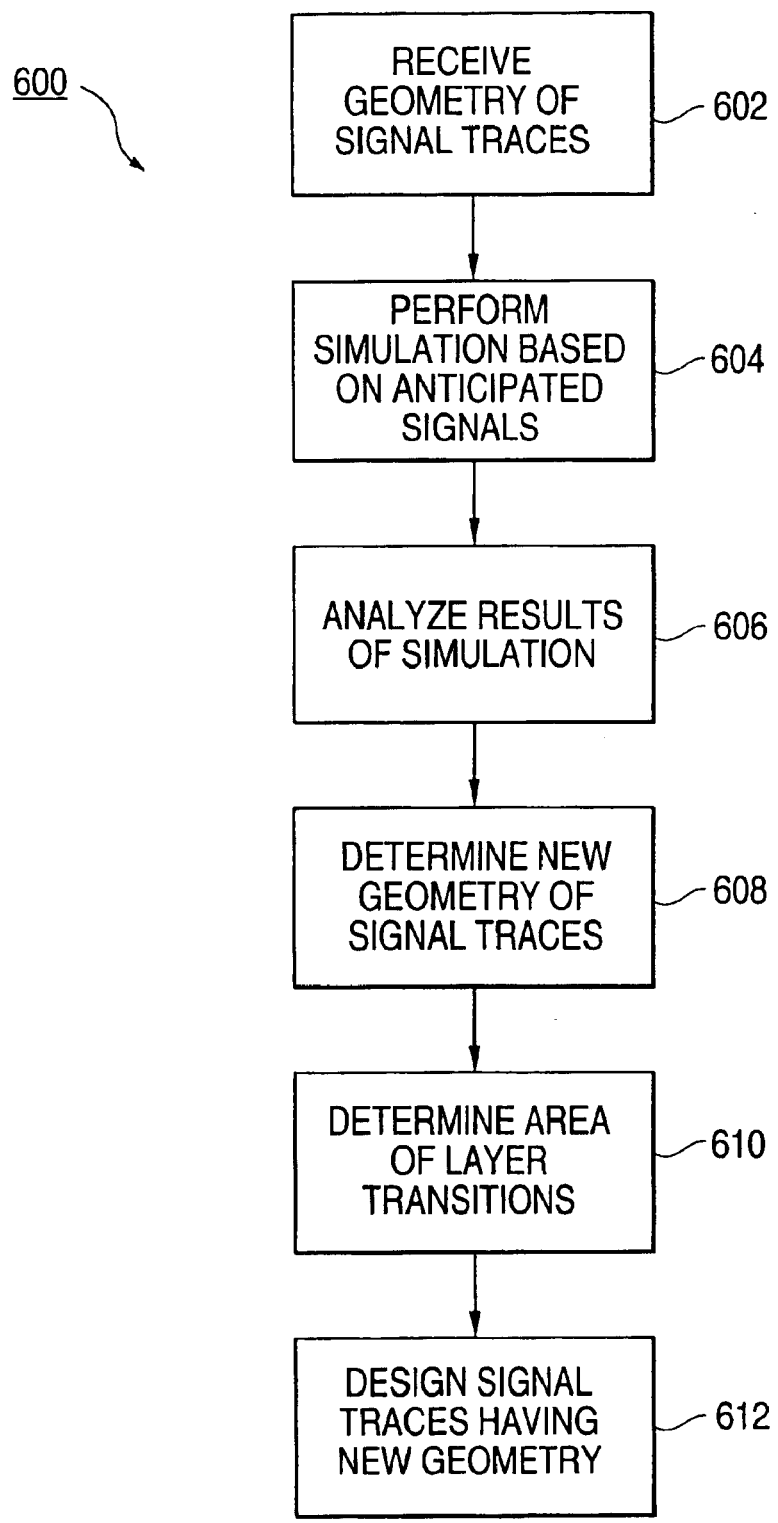

METHOD FOR REDUCING MULTILINE EFFECTS ON A PRINTED CIRCUIT BOARD

FIELD

The present invention is directed to the field of printed circuit boards. More particularly, the present invention is directed to a method for reducing multiline effects on a printed circuit board.

BACKGROUND

The trend in electronics toward higher speeds and denser packaging have increased problems of signal degradation due to crosstalk, simultaneous switching outputs (SSO), ground bounce due to power transients, and electromagnetic interference (EMI). Noise, interference, or other events between a transmitter and a receiver may alter a signal such that what is sent may not be what is received. The possibility of signal alteration, whether or not it actually occurs, creates a need for ways to improve signal integrity. These problems may increase if a plurality of signal lines are closely grouped together.

One technique implemented with printed circuit boards (PCBs) for reducing power noise utilizes on-board bypass capacitors, implemented either as discrete capacitors or as power/ground places within the PCB or a combination of both.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto.

The following represents brief descriptions of the drawings in which like reference numerals represent like elements and wherein:

FIG. 3A illustrates one orientation of parallel signal lines on a printed circuit board;

FIG. 3B illustrates another orientation of parallel signal lines on a printed circuit board according to an example embodiment of the present invention;

FIG. 6 is a flowchart showing operations of an example embodiment of the present invention.

DETAILED DESCRIPTION

Figure 1:
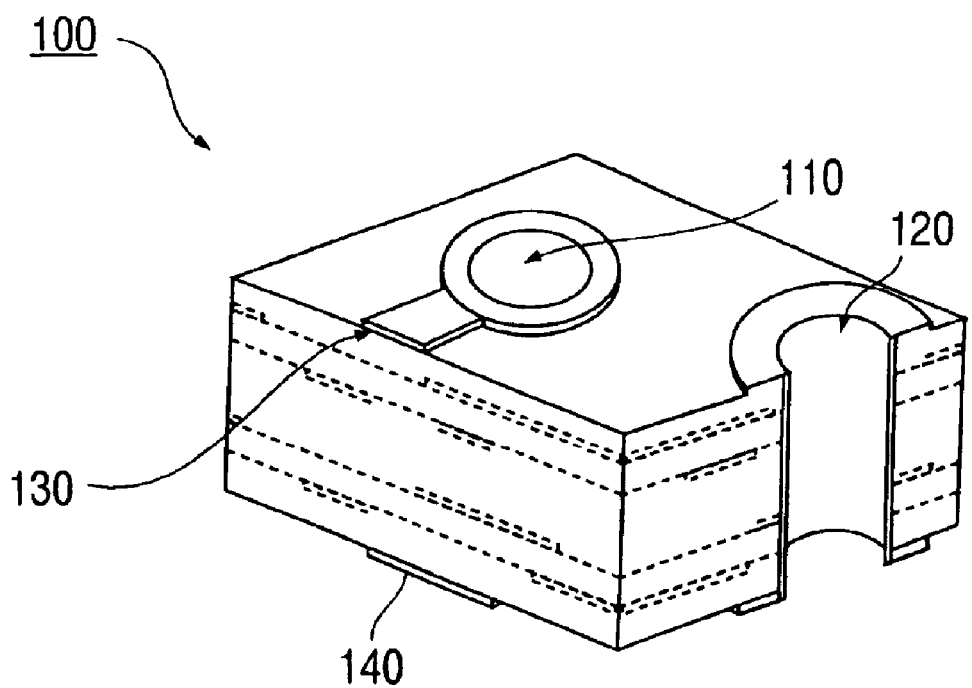
FIG. 1 illustrates an example printed circuit board.

In the following detailed description, like reference numerals and characters may be used to designate identical, corresponding or similar components in differing figure drawings. Where specific details (e.g., circuits, flowcharts) are set forth in order to describe example embodiments of the invention, it should be apparent to one skilled in the art that the invention can be practiced without, or with variation of, these specific details. It should also be apparent that differing combinations of hard-wired circuitry may be used to implement embodiments of the present invention. That is, the present invention is not limited to any specific combination of hardware. Additionally, the features shown in the figures (such as the vias and the traces) are not drawn to scale.

Embodiments of the present invention may be described with respect to substrates or layers having a top surface and a bottom surface. One skilled in the art would understand that any reference to a top surface and a bottom surface is merely exemplary of the figured drawings based on the orientation of the page. That is, a top surface on the figured drawings may not correspond to a top surface in actual use. It is intended that the terminology top and bottom are merely for reference with respect to the figured drawings. Furthermore, embodiments of the present invention may relate to various substrates such as multilayer printed circuit boards and multipacks or other carriers having multiple layers. Embodiments of the present invention may also be described with respect to a plurality of conductive paths (such as signal lines, conductive traces or vias) that may be grouped close together. These embodiments may be described with respect to fifteen conductive paths. This number is merely one example as embodiments of the present invention may include more and less than fifteen conductive paths.

Embodiments of the present invention may relate to a method of designing a printed circuit board that has closely packed signal lines (or traces). This method may include analyzing a timing characteristic of a plurality of conductive paths (such as traces or vias) on a printed circuit board or other type of substrate. Based on timing characteristics, a geometry, orientation or ordering of the conductive paths may be rearranged. That is, an order, geometry or orientation of a plurality of relatively parallel conductive paths may be changed based on the analyzed characteristics.

FIG. 1 illustrates an example printed circuit board 100 that may contain one or more layers of conductive circuitry supported and separated by dielectric material. As shown in FIG. 1, the printed circuit board 100 includes a first via 110 and a second via 120. The vias 110 and 120 may connect circuitry on different layers of the printed circuit board 100. FIG. 1 additionally shows numerous conductive traces such as a conductive trace 130 located on a top face (or surface) of the printed circuit board 100 and a conductive trace 140 located on a bottom face (or surface) of the printed circuit board 100. Although not labeled, the printed circuit board 100 includes additional conductive traces on the various layers of the printed circuit board 100. Embodiments of the present invention will be discussed with respect to different layers, conductive traces (such as the conductive traces 130 and 140) and vias (such as the vias 110 and 120) of the printed circuit board.

Embodiments of the present invention may be described with respect to relatively parallel conductive paths located on one layer of the printed circuit board. While the embodiments may be described with respect to the conductive paths being located on a single plane or layer, the present invention is not limited thereto. Rather, embodiments of the present invention relate to conductive paths (such as signal lines, traces or vias) that are in close proximity to one another such that they may provide noise interference when signals are routed from one location to another. As is known in the art, as a number of conductive paths (that are close together) increases, then the greater impact that conductive paths may have on each other. For example, if fifteen parallel signal lines are closely provided on a layer of a printed circuit board, then signals on the signal lines may cause interference with respect to each other.

Figure 2:
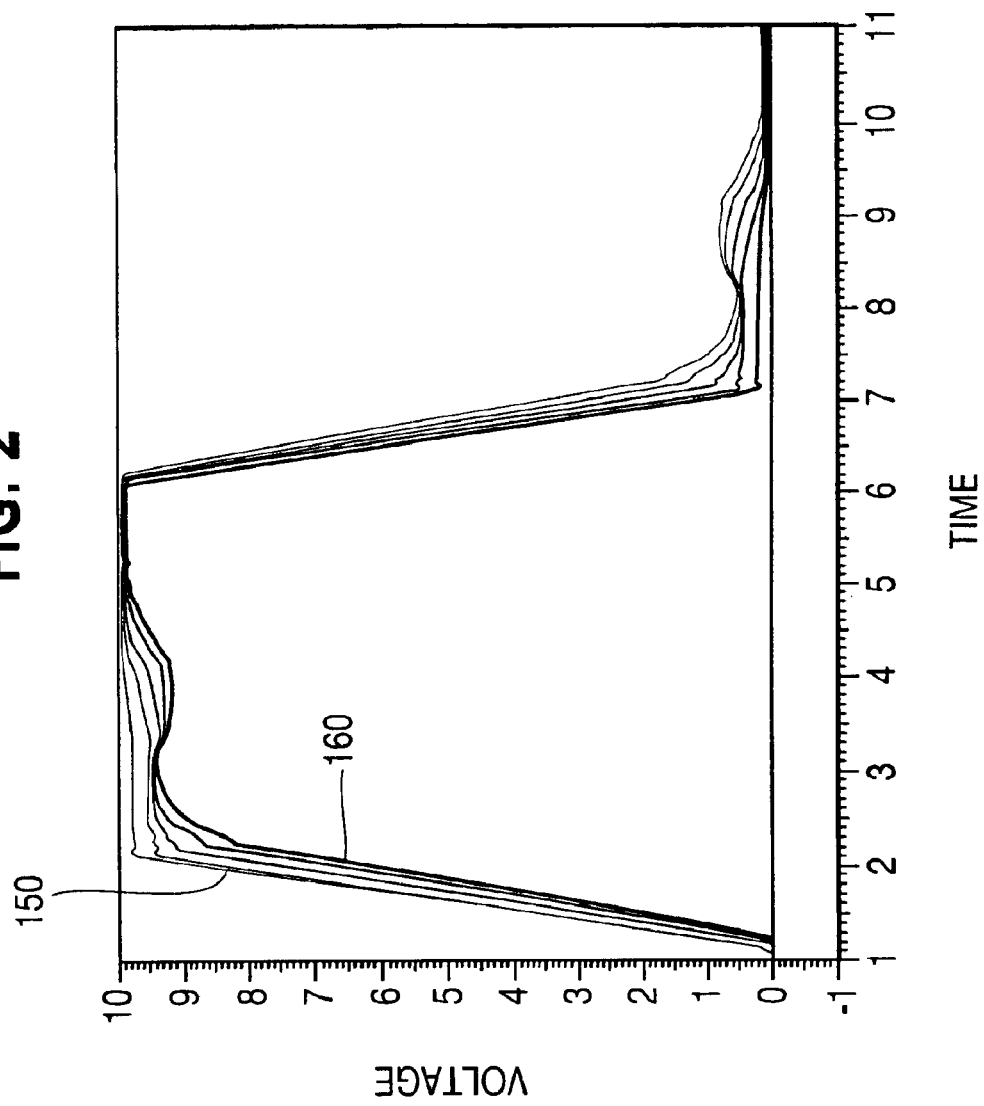
FIG. 2 is a graph illustrating various timings of a signal based on the number of neighboring signal lines.

FIG. 2 is a graph illustrating how closely grouped signal lines may influence one another. In FIG. 2, the horizontal axis represents time and the vertical axis represents voltage. FIG. 2 shows several curves representing a signal's voltage as it propagates along the respective signal lines. A curve 150 represents a timing diagram of a signal that passes along one conductive path of the printed circuit board. This may be considered the "ideal signal" as it does not have any significant interference from adjacent signal lines. The curve 160 represents a timing diagram of a signal on a signal line when similar signals are simultaneously propagated along the fourteen signal lines that are in close proximity to the one signal line. The FIG. 2 graph shows that the timing of the signals that propagate along the signal lines may differ depending on the number of signals that are simultaneously propagating along the signal lines. For example, at a voltage of 5.0, the curve 160 is delayed from the curve 150. This represents a signal delay when similar signals are propagated along neighboring signal lines. This delay may be an additional 40–200 psec margin for parallel routed signal lines. This type of delay may cause problems in the remaining circuitry of the printed circuit board. This delay may occur using any type of grouped signal lines or bus such as one having five or more signal lines operating at frequencies of 50 MHz or more.

Signal propagation along closely packed signal lines may operate in an even mode, an odd mode or in any of a number of ways between those two. As is known in the art, an even mode is a mode in which all the conductive paths (such as the fifteen conductive traces) propagate the same data at the same time. An odd mode is a mode in which all but one of the conductive paths (such as the center conductive path) propagate the same data at the same time. The odd mode and the even mode are opposite extremes of signal propagation conditions in which the data may be propagated along closely packed conductive paths. In an even mode in which all the signal lines propagate similar data at the same time, a phenomenon called push-out may occur. Push-out represents a delay of signals being propagated due to interference of signals on the neighboring signal lines. This may be especially true for a centrally located signal line that receives interference from its neighboring signal lines on both sides of the centrally located signal lines. For example, in FIG. 2 a push-put may be represented by the movement of the curve to the right (i.e., a signal delay). In an odd mode in which one signal line propagates data differently than the remaining signal lines, a phenomenon called pull-in may occur. Pull-in represents an increase in the timing of a signal being propagated along the one signal line due to the interference of signals on the neighboring signal lines. That is, the signal on the signal line operating differently may have its timing increased because of signals on the other signal lines. For example, in FIG. 2 a pull-in may be represented by movement of the curve to the left (i.e., signal timing increase).

Embodiments of the present invention may be directed towards push-out, pull-in and skew margins created to allow simultaneous switching output (SSO) effects to be comprehended in timing budgets for parallel routing geometries on a printed circuit board or package. That is, a set of parallel signal lines may create a cumulative impact on inner (or centrally located) signal lines (i.e., those signal lines located toward the center of the parallel signal lines). This electrically skews the center signal lines from the outer signal lines. The signal lines on the outside of the configuration may be impacted by their neighboring signal lines and may be "pushed-out" or "pulled-in" as compared to other SOS combinations. The extreme cases, such as the even mode and the odd mode as discussed above, illustrate this timing problem where increasing the number of parallel signal lines may have an increasingly large impact on the timing of inner signal lines. The result of the problem is timing margins that impose restrictions on the geometry of the lines, such as lengths, layers, separations, impedance matching, etc.

Embodiments of the present invention may thereby rearrange an orientation, geometry or ordering of the conductive paths (such as signal lines, traces or vias) in an effort to eliminate or minimize these problems of interference caused by neighboring conductive paths. That is, embodiments of the present invention may re-organize (or reorder) signal lines from a central location of the set of signal lines to an outside location of the set of signal lines, and vice versa. This reorganization or reordering may balance crosstalk effects across large groups of signals instead of allowing crosstalk to have a combined effect on individual members of the group. That is, distributing the crosstalk evenly across groups of signal lines may substantially reduce the peak crosstalk impact. Since the timing margin is created to compensate for the peak, the timing margin may be reduced. If the timing margin for skew and push-outs can be reduced, then a designer may choose between loosening restrictions on other timing issues such as routing, transfer rate, costs, etc.

FIG. 3A illustrates a top view of a first layer 200 of a printed circuit board having a plurality of signal lines 201–215. Although the figures are not drawn to scale, the signal lines 201–215 are intended to be closely arranged such that crosstalk and/or signal interference occurs. During a design stage, a designer may know the respective signals that will propagate along the signal lines 201–215 during actual operation. In this example, each of the signal lines 201–215 may be associated with a different numbered signal such as signals 1–15 shown on the right hand side of the first layer 200. The numbering of the signals 1–15 helps to better illustrate the rearrangement of the orientation or geometry of the signal lines as will be discussed below. The order of the numbers of the signals is not relevant. However, FIG. 3A shows that the signal line 208 propagates a signal 1, the signal line 209 propagates a signal 2, the signal line 207 propagates the signal 3, the signal line 210 propagates the signal 4, the signal line 206 propagates the signal 5, the signal line 211 propagates the signal 6, the signal line 205 propagates the signal 7, the signal line 212 propagates the signal 8, the signal line 204 propagates the signal 9, the signal line 213 propagates the signal 10, the signal line 203 propagates the signal 11, the signal line 214 propagates the signal 12, the signal 202 propagates the signal 13, the signal line 215 propagates the signal 14 and the signal line 201 propagates the signal 15.

As discussed above, crosstalk or interference may occur across the plurality of signal lines 201–215 based on the propagation of the signals 1–15. In order to reduce or minimize the effects caused by crosstalk or other interferences, an orientation (ordering or geometry) of the signals on the signal lines may be changed to avoid the crosstalk or other interferences. More specifically, FIG. 3B illustrates a top view of a second layer 300 of a printed circuit board having a plurality of signal lines 301–315. The second layer 300 is a different layer than the first layer 200. FIG. 3B further shows a different orientation or geometry of the signals that propagate on the signal lines 301–315 as compared to the orientation or geometry shown in FIG. 3A. That is, each of the signal lines 301–315 may be associated with a differently numbered signal such as the signals 1–15 discussed above with respect to FIG. 3A. In this example, a re-orientation of the signals on the signal lines occurs such that: the signal 1 is propagated along the signal line 315, the signal 2 is propagated along the signal line 314, the signal 4 is propagated along the signal line 313, the signal 6 is propagated along the signal line 312, the signal 8 is propagated along the signal line 311, the signal 10 is propagated along the signal line 310, the signal 12 is propagated along the signal line 309, the signal 14 is propagated along the signal 308, the signal 12 is propagated along the signal line 307, the signal 313 is propagated along the signal line 306, the signal 11 is propagated along the signal line 305, the signal 9 is propagated along the signal line 304, the signal 7 is propagated along the signal line 303, the signal 5 is propagated along the signal line 302 and the signal 3 is propagated along the signal line 301. As may be clearly visible by observing FIGS. 3A and 3B, the orientation of the signals 1–15 is different on the first layer 200 than on the second layer 300. The rearrangement may be based on the respective signals that may propagate along the signal lines during actual operation. The rearrangement may thereby minimize crosstalk effects.

Embodiments of the present invention may utilize different geometric implementations between different layers to accomplish the rearrangement. One solution may use the same routing channel and accomplish rotation or rearrangement of signals at a layer transition for all the signal lines. Another solution may utilize a passive element, a set of passive elements or even active parts, a wire, an overlay, or any other device to change the orientation relative to each other. Similarly, the rearrangement of the geometry of the signals may be accomplished in a turn with a crossover mechanism (i.e., a layer transition or otherwise) that may provide convenient length properties. Multiple transitions or alternate schemes for ordering of the signals may also arise as they have the effect of distributing otherwise concentrated coupling effects across a set of traces, more or less evenly.

Figure 4:
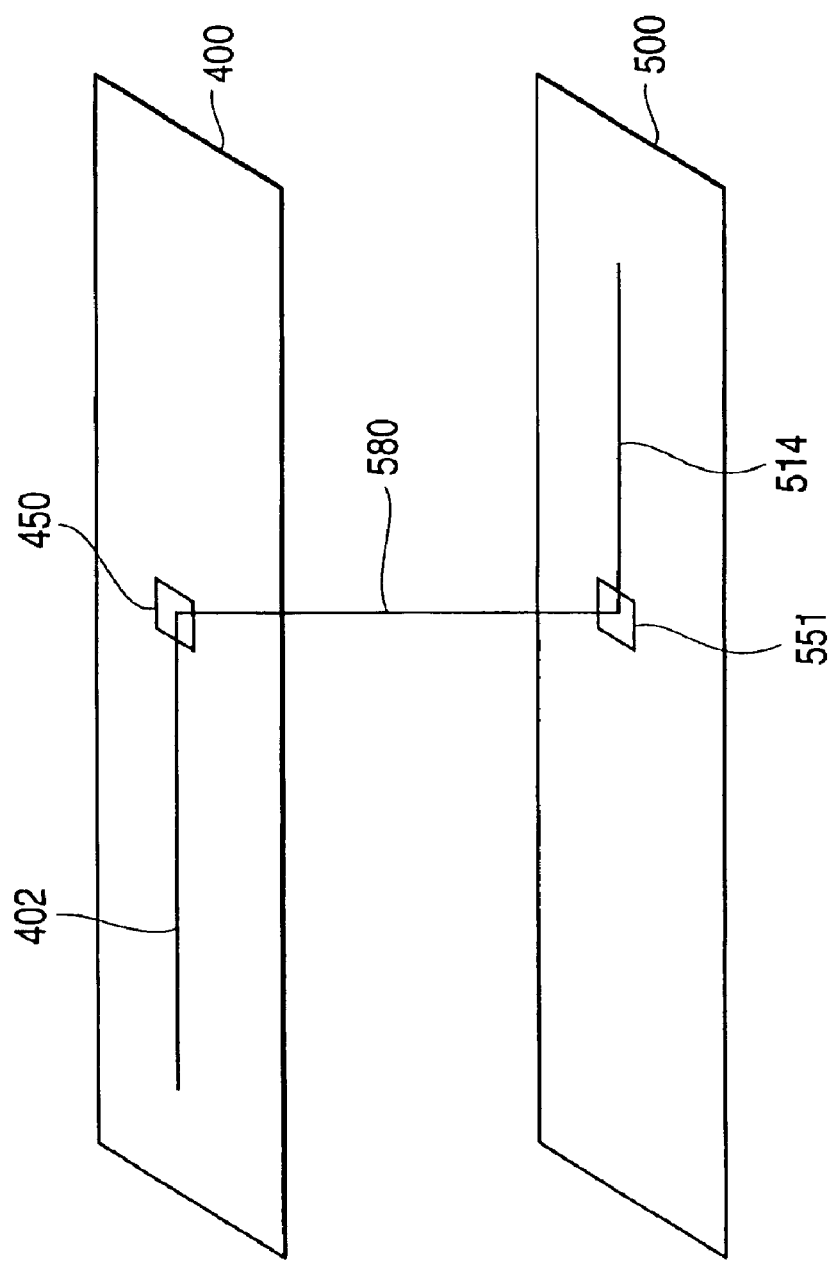
FIG. 4 illustrates two layers and a via of a printed circuit board.

FIG. 4 illustrates two layers of a printed circuit board according to an example embodiment of the present invention. Other embodiments and configurations are also within the scope of the present invention. The printed circuit board shown in FIG. 4 may correspond to the printed circuit board 100 shown in FIG. 1. However, for ease of illustration, only two layers of the printed circuit board are shown. That is, FIG. 4 shows a first layer 400 and a second layer 500 of the printed circuit board. FIG. 4 also shows a signal line 402 coupling to a via 450 on the first layer 400 and a signal line 514 coupling to a via 551 on the second layer 500. A conductive path 580 is shown that couples the via 450 to the via 551. In actuality, a via is the conductive path between two layers of the printed circuit board. For ease of illustration, this conductive path may be shown as a square region in the figure drawings.

Figure 5A:
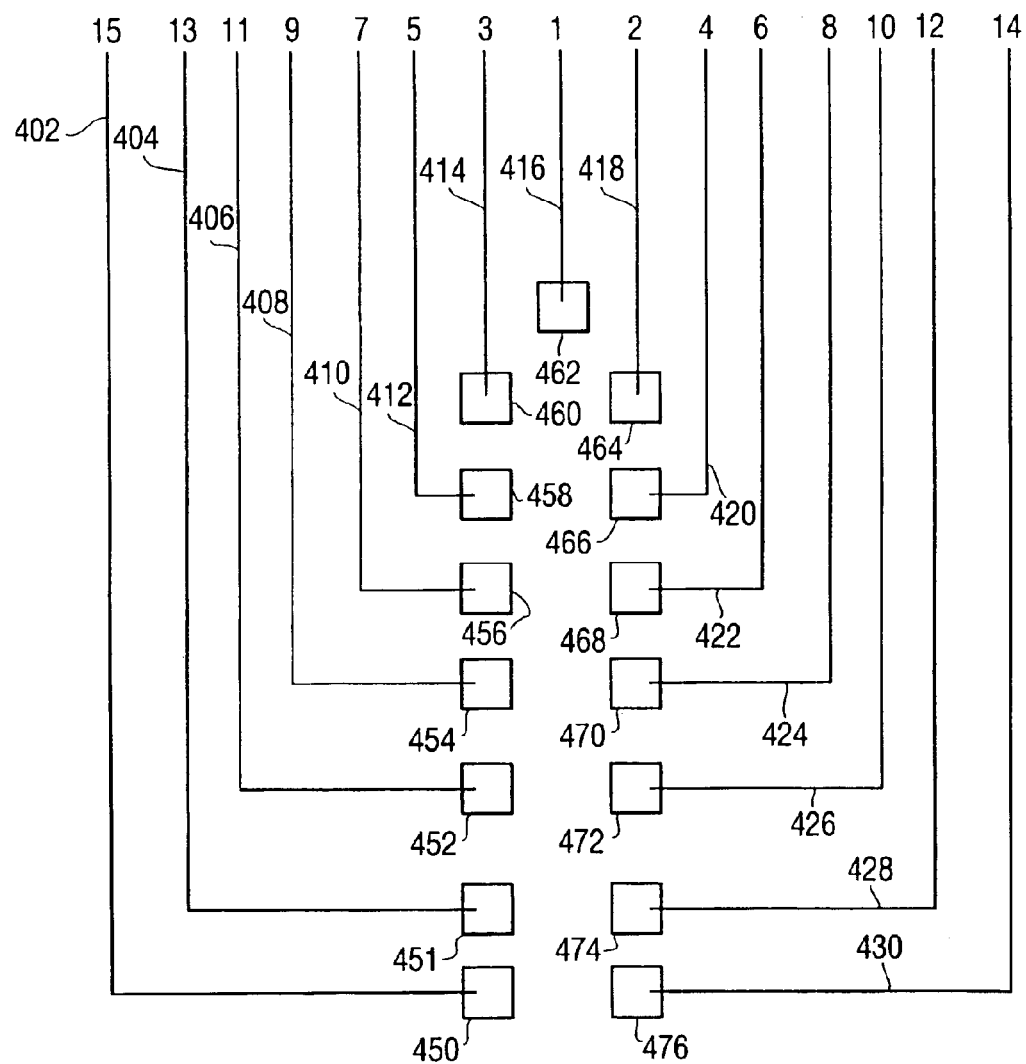
FIG. 5A illustrates one orientation of signal lines and vias on a layer of a printed circuit board according to an example embodiment of the present invention.

FIG. 5A illustrates an original geometry or orientation of signal lines on the first layer 400 (shown in FIG. 4). More specifically, FIG. 5A shows a plurality of signal lines 402–430 that are arranged in a relatively parallel manner on the first layer 400. Each of the signal lines may be coupled to a corresponding via (or via path) 450–476. In a similar manner as discussed above with respect to FIGS. 3A and 3B, each of the signal lines 402–430 may be associated with a corresponding one of the signals 1–15. For example, the signal line 402 may propagate the signal 15 to the via 450, the signal line 404 may propagate the signal 13 to the via 451, the signal line 406 may propagate the signal 11 to the via 452, the signal line 408 may propagate the signal 9 to the via 454, the signal line 410 may propagate the signal 7 to the via 456, the signal line 412 may propagate the signal 5 to the via 458, the signal line 414 may propagate the signal 3 to the via 460, and the signal line 416 may propagate the signal 1 to the via 462. Additionally, the signal line 418 may propagate the signal 2 to the via 464, the signal line 420 may propagate the signal 4 to the via 466, the signal line 422 may propagate the signal 6 to the via 468, the signal line 424 may propagate the signal 8 to the via 470, the signal line 426 may propagate the signal 10 to the via 472, the signal line 428 may propagate the signal 12 to the via 474 and the signal line 430 may propagate the signal 14 to the via 476.

Figure 5B:
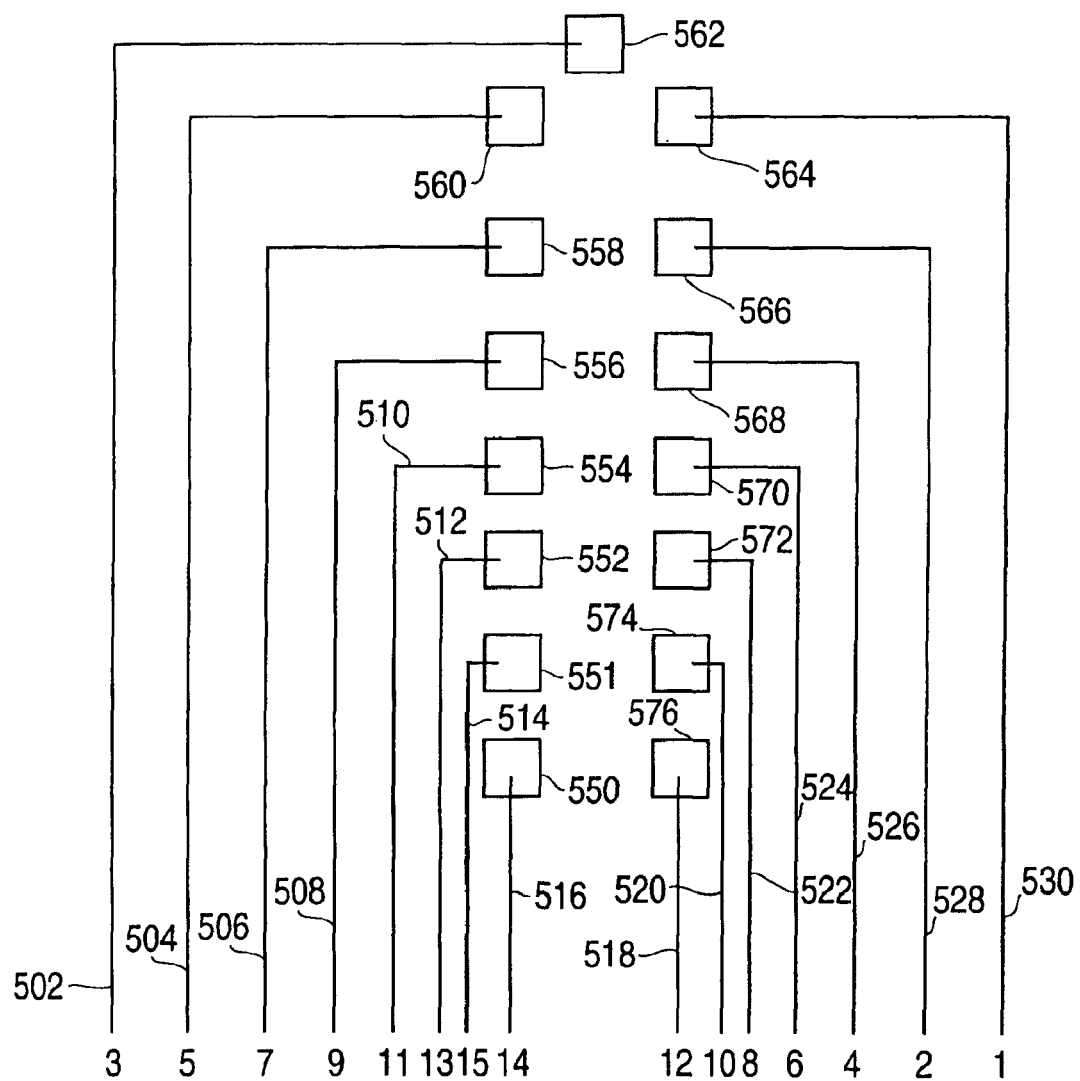
FIG. 5B illustrates another orientation of signal lines and vias on another layer of a printed circuit board according to an example embodiment of the present invention.

After observing timing characteristics of expected signals on the signal lines 402–430, a designer may determine a reorientation or rearrangement of the signals on the signal lines to minimize or reduce crosstalk or other interference effects. For example, FIG. 5B illustrates another orientation or geometry of signals on the signal lines on the second layer 500. More specifically, FIG. 5B shows a plurality of signal lines 502–530 on the second layer 500. Each of the signal lines 502–530 may be coupled to a corresponding via in the layer 500. Vias 550–576 are in a similar pattern to the vias 450–476 of FIG. 5A. More specifically, the via 450 corresponds to the via 550, the via 451 corresponds to the via 551, the via 452 corresponds to the via 552, the via 454 corresponds to the via 554, the via 456 corresponds to the via 556, the via 458 corresponds to the via 558, the via 460 corresponds to the via 560, the via 462 corresponds to the via 562, the via 464 corresponds to the via 564, the via 466 corresponds to the via 566, the via 468 corresponds to the via 568, the via 470 corresponds to the via 570, the via 472 corresponds to the via 572, the via 474 corresponds to the via 574, and the via 476 corresponds to the via 576.

As shown, the signal line 502 may propagate the signal 3 from the via 562, the signal line 504 may propagate the signal 5 from the via 560, the signal line 506 may propagate the signal 7 from the via 558, the signal line 508 may propagate the signal 9 from the via 556, the signal line 510 may propagate the signal 11 from the via 554, the signal line 512 may propagate the signal 13 from the via 552, the signal line 514 may propagate the signal 15 from the via 551, the signal line 516 may propagate the signal 14 from the via 550. Additionally, the signal line 518 may propagate the signal 12 from the via 576, the signal line 520 may propagate the signal 10 from the via 574, the signal line 522 may propagate the signal 8 from the via 572, the signal line 524 may propagate the signal 6 from the via 570, the signal line 526 may propagate the signal 4 from the via 568, the signal line 528 may propagate the signal 2 from the via 566 and the signal line 530 may propagate the signal 1 from the via 564.

By this arrangement, the signals 1–15 on the signal lines 502–530 are arranged in a different order as compared to the ordering of the signals 1–15 on the signal lines 402–430. This rearrangement or reordering may occur at a layer transition (through vias) between the layer 400 and the layer 500. The rearrangement is accomplished by the coupling of the signal lines to the respective vias so as to rearrange the expected signals on the signal lines and to minimize multi-line effects.

Accordingly, by analyzing timing relationships (such as push-outs and pull-ins) of the signals on the signal lines, a designer may rearrange the orientation or geometry of the signals on the signal lines. This rearrangement may occur within a layer transition by the appropriate coupling of signal lines to vias.

FIG. 6 illustrates a flowchart for performing embodiments of the present invention. Other embodiments, operations and orders of operations are also within the scope of the present invention. More specifically, FIG. 6 illustrates a flowchart 600 in which an initial geometry of signal traces is received in block 602. In block 604, a simulation may be performed on the signal traces based on the anticipated signals that will propagate along the signal traces in actual operation. The results of the simulation (such as push-out and pull-in) may be analyzed in block 606. In block 608, a new geometry or arrangement of signal traces may be determined based on analyzed results of the simulation. For example, the signal line that propagates a signal 1 in the above described FIG. 3A may be rearranged from an inside position (on the signal line 208) to an outside position (on the signal line 315) to avoid problems of push-out or pull-in, for example. In block 610, an area to perform a rearrangement (such as a layer transition) may be determined. Subsequently, in block 612 the signal traces may be designed having the new geometry after the layer transition.

The number of different geometries may vary with the number of lines and the requirements of the board. Further, embodiments of the present invention may be performed in more than one layer transition (such as two or more layer transitions). In this case, the signal lines may begin and end with the same geometry orientation with the orientation changed for some difference between the two points having the same geometry. That is, multiple changes in the geometry or arrangement may be provided along a PCB. Additionally, if there were a pair of layer transitions, portions (such as 50%) of the lines may be rearranged at one transition and other portions may be rearranged at the other transition. Further, while embodiments may have been described as changing for signal lines at layer transitions, embodiments of the present invention are also applicable to changing orientations of signals propagating through vias. For example, a geometry of the signals propagating through a first set of vias may be changed to a new geometry of signals propagating through a second set of vias by the use of the signal lines (or other elements) coupling the first set of vias to the second set of vias.

Accordingly, embodiments of the present invention may analyze characteristics of signals (such as timings) passing along a first plurality of conductive paths (such as conductive traces, vias and/or signal lines) that are arranged in a first orientation or geometry. A new orientation or geometry may be determined for a second plurality of conductive paths located on a different layer or plane based on the analyzed results.

Any reference in this specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance. That is, some procedures may be able to be performed in an alternative ordering, simultaneously, etc.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A method comprising:
   analyzing characteristics of signals passing along a first plurality of conductive paths arranged in a first arrangement;
   determining a second arrangement for a second plurality of conductive paths based on said analyzed characteristics, the second arrangement effecting a rearrangement of the first plurality of conductive paths; and
   designing a structure having the first plurality of conductive paths arranged in the first arrangement and the second plurality of conductive paths in the determined second arrangement.

2. The method of claim 1, wherein said characteristics comprise timing relationships of signals across said first plurality of conductive paths.

3. The method of claim 2, wherein said timing relationships relate to one of push-out and pull-in of signal timings.

4. The method of claim 1, wherein said first plurality of conductive paths are on a first plane and arranged in said first arrangement and said second plurality of conductive paths are on a second plane and arranged in said second arrangement.

5. The method of claim 1, wherein said first plurality of conductive paths comprise a first plurality of traces on a first layer of a printed circuit board and said second plurality of conductive paths comprise a second plurality of traces on a second layer of said printed circuit board.

6. The method of claim 5, wherein said first plurality of traces are arranged on said first layer in a first order and said second plurality of traces are arranged on said second layer in a second order and determining said second arrangement comprises determining said second order based on the analyzed characteristics.

7. The method of claim 1, wherein said first plurality of conductive paths comprise a first plurality of vias coupling a first layer of a printed circuit board to a second layer of said printed circuit board, and said second plurality of conductive paths comprise a second plurality of vias coupling said first layer of said printed circuit board to said second layer of said printed circuit board.

8. A method of designing a printed circuit board comprising:
   analyzing at least one characteristic of a first plurality of relatively parallel conductive paths on said printed circuit board, said first plurality of relatively parallel conductive paths being arranged in a pattern in a first area of said printed circuit board;

rearranging said pattern of conductive paths based on the analyzed at least one characteristic such that at least a portion of at least one of a second plurality of relatively parallel conductive paths in a second area of said printed circuit board is laterally offset with respect to a corresponding path of said first plurality of relatively parallel conductive paths in said first area; and designing the printed circuit board having the first plurality of relatively parallel conductive paths and the second plurality of relatively parallel conductive paths.

9. The method of claim 8, wherein said at least one characteristic comprises a timing relationship of signals along said first plurality of relatively parallel conductive paths.

10. The method of claim 9, wherein said timing relationship relates to one of push-out and pull-in of signal timings.

11. The method of claim 8, wherein said first plurality of relatively parallel conductive paths are on a first layer of said printed circuit board and said second plurality of relatively parallel conductive paths are on a second layer of said printed circuit board.

12. The method of claim 8, wherein said first plurality of relatively parallel conductive paths comprise a first plurality of traces on a first layer of said printed circuit board and said second plurality of relatively parallel conductive paths comprise a second plurality of traces on a second layer of said printed circuit board.

13. The method of claim 12, wherein said first plurality of traces are arranged on said first layer in a first ordered arrangement and said second plurality of traces are arranged on said second layer in a second ordered arrangement, and rearranging said pattern comprises determining said second ordered arrangement based on said analyzed at least one characteristic.

14. The method of claim 8, wherein said first plurality of relatively parallel conductive paths comprise a first plurality of vias coupling a first layer of said printed circuit board to a second layer of said printed circuit board, and said second plurality of conductive paths comprise a second plurality of vias coupling said first layer of said printed circuit board to said second layer of said printed circuit board.

15. A method comprising:

analyzing a characteristic of a first plurality of conductive paths arranged in a first pattern;

altering said characteristic by rearranging said pattern to form a second pattern; and designing a structure to have said first pattern and said second pattern;

wherein altering said characteristic comprises determining the second pattern for a second plurality of conductive paths based on said analyzed characteristic, the second pattern effecting a rearrangement of the first plurality of conductive paths.

16. The method of claim 15, wherein said characteristic comprises a timing relationship of signals across said first plurality of conductive paths.

17. The method of claim 16, wherein said timing relationship relates to one of push-out and pull-out of signal timings.

18. The method of claim 15, wherein said first plurality of conductive paths are on a first plane and arranged in said first pattern and said second plurality of conductive paths are on a second plane and arranged in said second pattern.

19. The method of claim 15, wherein said first plurality of conductive paths comprise a first plurality of traces on a first layer of a printed circuit board and said second plurality of conductive paths comprise a second plurality of traces on a second layer of said printed circuit board.

20. The method of claim 15, wherein said first plurality of conductive paths comprise a first plurality of vias coupling a first layer of a printed circuit board to a second layer of said printed circuit board, and said second plurality of conductive paths comprise a second plurality of vias coupling said first layer of said printed circuit board to said second layer of said printed circuit board.

* * * * *